(12) United States Patent
Milton

(10) Patent No.: US 6,507,230 B1
(45) Date of Patent: Jan. 14, 2003

(54) CLOCK GENERATOR HAVING A DESKEWER

(75) Inventor: David Wills Milton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,151

(22) Filed: Jun. 16, 2000

(51) Int. Cl.[7] .............................................. H03H 11/26
(52) U.S. Cl. ......................... 327/291; 327/299; 327/166
(58) Field of Search ................................ 327/141, 154, 327/161, 164, 165, 166, 261, 262, 291, 292, 293, 294, 299; 326/93, 99

(56) References Cited

U.S. PATENT DOCUMENTS

| | | | | | |
|---|---|---|---|---|---|
| 5,036,221 A | * | 7/1991 | Brucculeri et al. | ............ | 326/94 |
| 5,313,951 A | * | 5/1994 | Thacker | ...................... | 375/117 |
| 5,487,163 A | * | 1/1996 | Keeley | ........................ | 395/550 |
| 5,627,795 A | * | 5/1997 | Nitta | ............................ | 365/233 |
| 5,642,060 A | * | 6/1997 | Kaneko | ......................... | 326/93 |
| 5,706,485 A | * | 1/1998 | Barkatullah et al. | ......... | 395/552 |
| 5,719,517 A | * | 2/1998 | Nakao | ........................... | 327/291 |
| 5,726,593 A | * | 3/1998 | Ruuskanen | ................... | 327/99 |
| 5,731,715 A | * | 3/1998 | Mote, Jr. | ....................... | 326/93 |
| 5,973,523 A | * | 10/1999 | Kusomoto et al. | ........... | 327/146 |
| 6,072,347 A | * | 6/2000 | Sim | ............................. | 327/276 |
| 6,081,148 A | * | 6/2000 | Song | ............................ | 327/292 |
| 6,130,566 A | * | 10/2000 | Yokimizo | .................... | 327/175 |

* cited by examiner

Primary Examiner—Timothy P. Callahan
Assistant Examiner—Hai L. Nguyen
(74) Attorney, Agent, or Firm—Richard A. Henkler; Bracewell & Patterson, L.L.P.

(57) ABSTRACT

A clock generator having a deskewer is disclosed. The clock generator includes a waveform generator and a deskewer. Clocked by an input clock signal, the waveform generator generates a waveform signal. The deskewer circuit, which is connected to the waveform generator, gates the waveform signal from the waveform generator with the input clock signal to produce an output clock signal such that the output clock signal has less skew with respect to the input clock signal.

11 Claims, 3 Drawing Sheets

CLOCK GENERATOR HAVING A DESKEWER

BACKGROUND OF THE INVENTION

1. Technical Field

The present invention relates to digital circuits in general, and in particular to clock generation circuits. Still more particularly, the present invention relates to a clock generator having a deskewer.

2. Description of the Prior Art

A clock signal includes periodic transitions between a high and a low voltage levels at a rate typically described in terms of frequency, which is measured by the number of high/low transitions that occur per second. Within an integrated circuit, the timing of various digital logic circuits is typically controlled by one or more clock signals. The clock signals are utilized to synchronize bus cycles of the digital logic circuits. Hence, all digital logic circuits within the integrated circuit initiate data operations based upon the clock signals. More specifically, digital logic circuits change the state of their output signals in conjunction with the rising and/or falling edge of the clock signals.

Within an integrated circuit, clock signals are typically generated by a clock generator. Sometimes, when different digital logic circuits within an integrated circuit require clock signals of different frequencies, separate clock generators may be utilized to generate a clock signal of a specific frequency to cater the needs of the different digital logic circuits. When multiple clock generators are utilized to feed clock signals to different digital logic circuits within the integrated circuit, a difference in delay time may occur among the clock signal inputs to each of the digital logic circuits. This delay time is known as clock skew. Although clock skews are generally unavoidable because they can also be caused by many minute process variations occurred during fabrication, the present disclosure provides an improved clock generator with reduced clock skews.

SUMMARY OF THE INVENTION

In accordance with a preferred embodiment of the present invention, a clock generation circuit includes a waveform generator and a deskewer. Clocked by an input clock signal, the waveform generator generates a waveform signal. The deskewer circuit, which is connected to the waveform generator, gates the waveform signal from the waveform generator with the input clock signal to produce an output clock signal such that the output clock signal has less skew with respect to the input clock signal.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
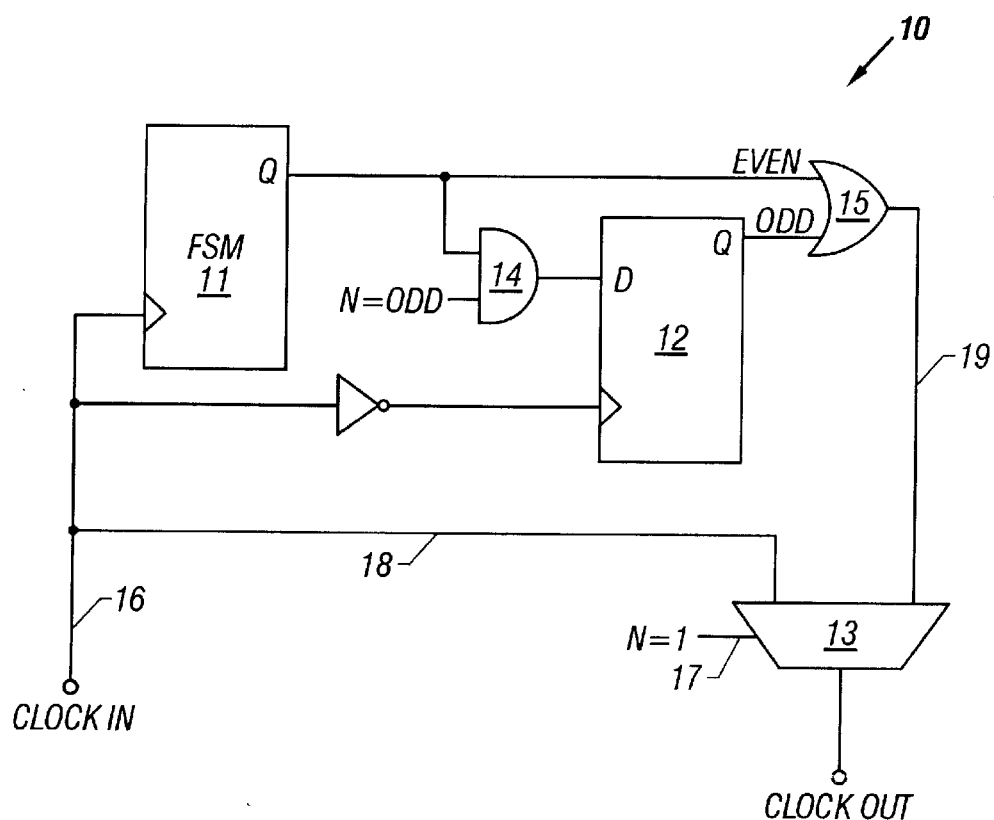
FIG. 1 is a block diagram of a first clock generation circuit according to the prior art.

Consider the following two prior art clock generation circuits from which a 50% duty cycle clock is desired. Referring now to the drawings and in particular to FIG. 1, there is depicted a block diagram of a first clock generation circuit according to the prior art. As shown, a clock generator circuit 10 includes a finite state machine (FSM) 11, a D flip-flop 12, a multiplexor 13, and various logic gates.

Generally, FSM 11 performs clock divisions on a clock-in signal 16. However, FSM 11 cannot provide divide-by-one operation and cannot provide 50% duty cycle for odd clock divisions. Thus, multiplexor 13 is utilized to provide a divide-by-one path 18 via a control 17. In addition, D flip-flop 12 along with an AND logic gate 14 and an OR logic gate 15, which are known as a half-cycle pulse stretcher, are utilized to extend the odd clock divisions in order to achieve a 50% duty cycle.

There are at least three problems associated with clock generator circuit 10. First, divide-by-one path 18 has a different length than divide-by-N path 19. Second, divide-by-N path 19 has two different paths between odd clock divisions and even clock divisions. Third, there are too many components in the longest path of clock generator circuit 10, namely, FSM 11, AND logic gate 14, D flip-flop 12, OR logic gate 15, and multiplexor 13. Thus, when several clock generation circuits 10 are used to feed clock signals to different logic circuits within an integrated circuit, a large clock skew is likely to occur among the clock inputs to each of the logic circuits.

Figure 2:
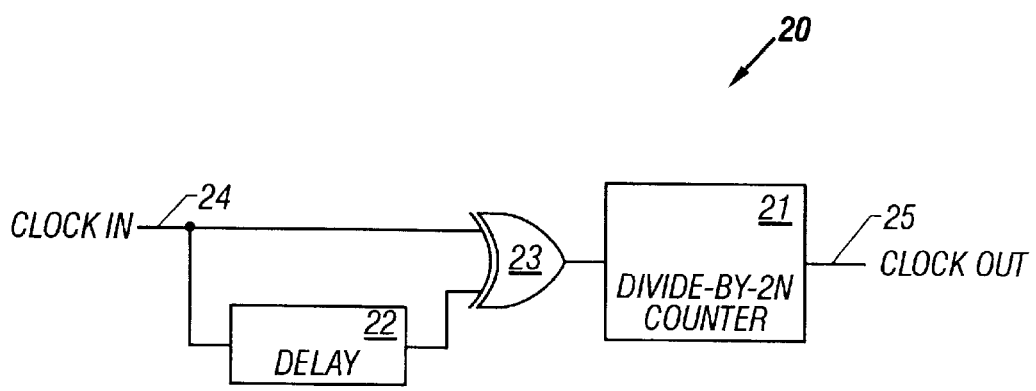
FIG. 2 is a block diagram of a second clock generation circuit according to the prior art.

With reference now to FIG. 2, there is a block diagram of a second clock generation circuit according to the prior art. As shown, a clock generation circuit 20 includes a divide-by-2N counter 21, a delay circuit 22, and an XOR logic gate 23. Instead of using an FSM divider (such as in clock generation circuit 10 from FIG. 1), clock generation circuit 20 utilizes a clock doubler (i.e., delay circuit 22 and XOR logic gate 23) followed by divide-by-2N counter 21 to perform even clock divisions and the 50% duty cycle requirement.

There are at least four problems associated with clock generation circuit 20. First, delay circuit 22 must be carefully tuned in order to accommodate different clock frequencies. Second, the requirement of a 2X clock as the clock input to divide-by-2N counter 21 may be limited by the current technology. Third, timing analysis must be performed for the paths through XOR logic gate 23 that ultimately generate clock-out signal 25. Fourth, there are still too many components in the longest path of clock generation circuit 20, namely, XOR logic gate 23, a clock tree (within divide-by-2N counter 21), a clock splitter (within divide-by2N counter 21), and a register (within divide-by-2N counter 21). Thus, similar to clock generation circuit 10 from FIG. 1, a large clock skew is likely to occur among the clock inputs to each logic circuits when several clock generation circuits 20 are used to feed clock signals to different logic circuits within an integrated circuit.

Figure 3:
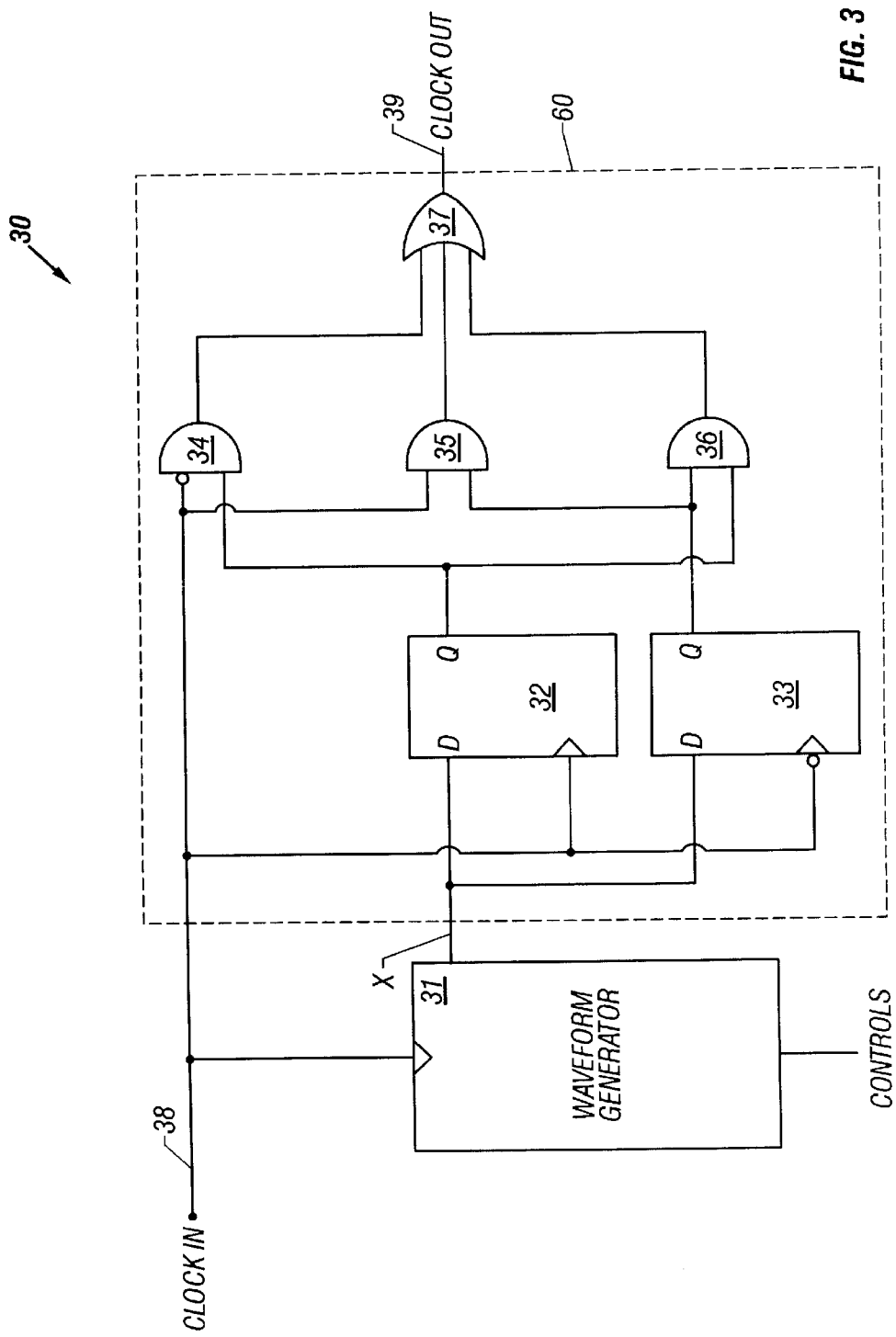
FIG. 3 is a block diagram of a clock generation circuit in accordance with a preferred embodiment of the present invention.

The present invention provides an improved clock generation circuit with less clock skews. Referring now to FIG. 3, there is illustrated a block diagram of a clock generation circuit in accordance with a preferred embodiment of the present invention. As shown, a clock generation circuit 30 includes a waveform generator 31 and a clock deskewer 60. Waveform generator 31 may be implemented by any waveform generator circuit that is well-known in the art. For example, waveform generator 31 can be implemented with clock generation circuit 10 from FIG. 1 or clock generation circuit 20 from FIG. 2.

Clock deskewer 60 includes two D flip-flops 32–33, three two-input AND logic gates 34-36, and one three-input OR logic gate 37. Clock deskewer 60 gates (or couples) a waveform signal from output x of waveform generator 31 with clock-in signal 38 to generate a clock-out signal 39. Clock deskewer 60 delays the waveform signal from output x for one clock cycle, in accordance with the clock cycle of clock-in signal 38. In essence, clock deskewer 60 acts upon the waveform signal from output x of waveform generator 31 very much like a pipeline set of registers acts for data flow signals. As a result, clock-out signal 39 is timed extremely tightly with respect to clock-in signal 38 with little skew.

There are two critical timing paths in clock generation circuit 30. The first critical timing path is an inverter (shown as a "bubble") at one input of AND logic gate 34, AND logic gate 34, and OR logic gate 37. The second critical timing path is a buffer (not shown) at one input of AND logic gate 35, AND logic gate 35, and OR logic gate 37. The purpose of the buffer at the input of AND logic gate 35 is to match the timing of the inverter at the input of AND logic gate 34. AND logic gate 36 is not in the critical timing path. The above-mentioned two critical paths for clock generation circuit 30 can be implemented with NAND logic gates, as they are understood by those skilled in the art.

One obvious advantage of clock generation circuit 30 over the clock generation circuits in FIGS. 1, 2 is the much shorter critical timing path. In addition, the symmetry between logic gate-pair 34/37 and logic gate-pair 35/37 provides for minimum pulse shrinkage for clock-out signal 39.

Furthermore, clock generation circuit 30 can output a clock-out signal 39 of either a rising edge or a falling edge derived from either one of the edges of clock-in signal 38.

The only condition is that the output waveform of waveform generator 31 needs to meet the half duty cycle set up and hold time requirements at D flip-flops 32, 33, which can easily be done with an extra set of pipelining registers if necessary.

Figure 4:
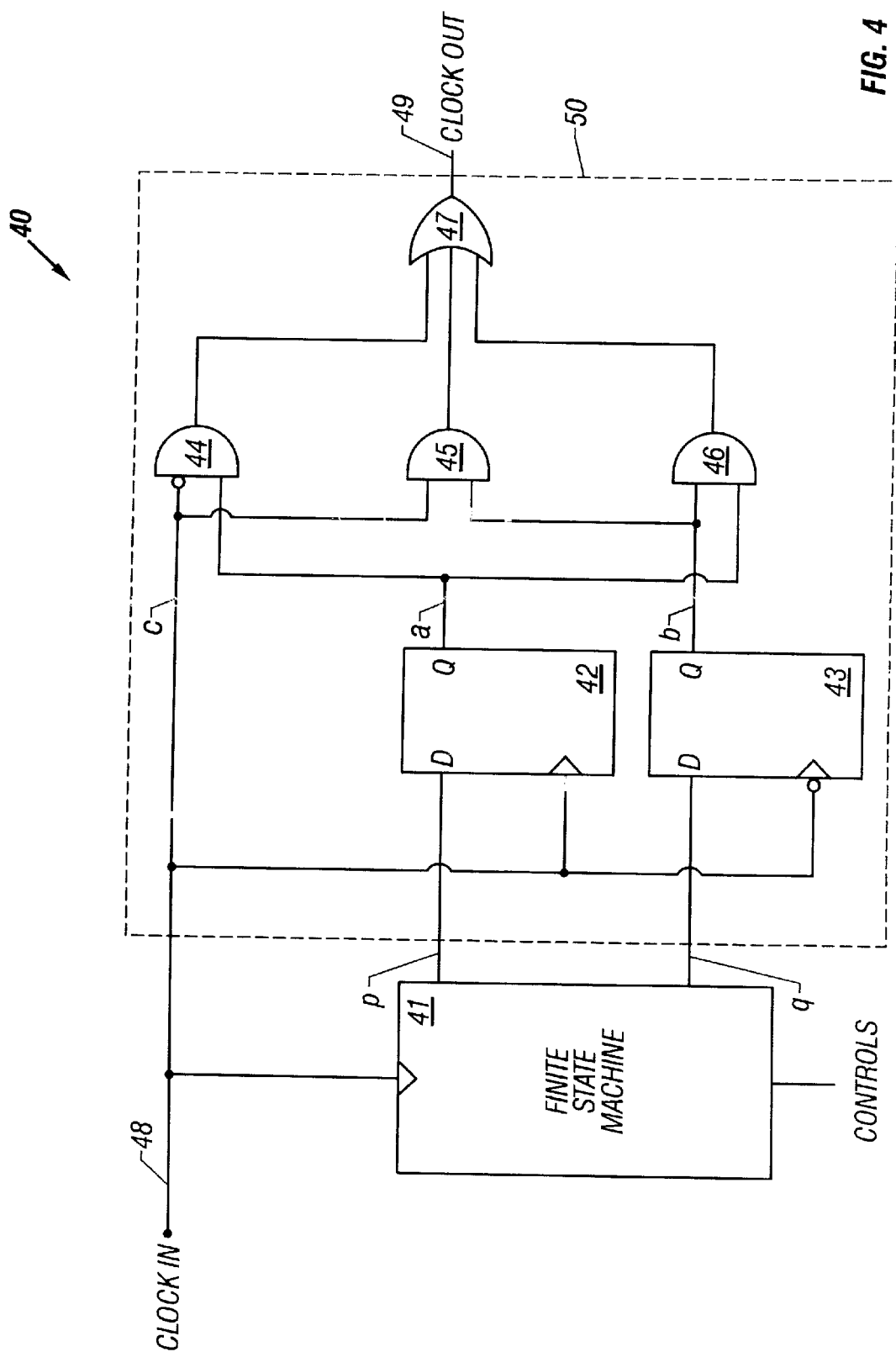
FIG. 4 is a block diagram of a clock generation circuit in accordance with an alternative embodiment of the present invention.

With reference now to FIG. 4, there is illustrated a block diagram of a clock generation circuit in accordance with an alternative embodiment of the present invention. As shown, a clock generation circuit 40 includes a FSM 41 and a clock deskewer 50. Instead of operating at a 2X clock frequency like clock generation circuit 20 from FIG. 2, FSM 41 operates at a 1X clock frequency to separately encode information on two outputs p, q that enables clock generation circuit 40 to propagate one or two clock edges for every clock cycle. For every clock cycle, 25 FSM 41 generates two values at outputs p and q. Output p yields a value of the first half of a clock cycle, and output q yield a value of the second half of the same clock cycle, or vice versa. The values at outputs p and q may be different in each clock cycle.

Clock deskewer 50 includes two D flip-flops 42–43, three two-input AND logic gates 44–46, and one three-input OR logic gate 47. The boolean expression for AND logic gates 44–46 and OR logic gate 47 is as follows:

$$(\overline{c} \text{ AND } a) \text{ OR } (c \text{ AND } b) \text{ OR } (b \text{ AND } a)$$

where a and b are outputs from flip-flops 42, 43, respectively, and c is clock-in signal 48. Similar to clock deskewer 60 from FIG. 3, clock deskewer 50 gates (or couples) waveform signals from outputs a and b of FSM 41 with clock-in signal 48 to generate a clock-out signal 49. Clock deskewer 50 delays the waveform signals from both outputs a and b for one clock cycle, according to the clock cycle of clock-in signal 48. Clock deskewer 50 acts upon the waveform signals from outputs a and b of FSM 41 very much like a pipeline set of registers acts for data flow signals. Thus, clock-out signal 49 is fully under the control of FSM 41 on a cycle by cycle basis. As a result, clock-out signal 49 is timed extremely tightly with respect to clock-in signal 48 with little skew.

As has been described, the present invention provides an improved clock generation circuit with reduced clock skews. Although the deskewer circuit in FIGS. 3 and 4 are implemented with three AND logic gates and one OR logic gate, the deskewer circuit can also be implemented with NAND or other logic gates as they are understood by those skilled in the art.

While the invention has been particularly shown and described with reference to a preferred embodiment, it will be understood by those skilled in the art that various changes in form and detail may be made therein without departing from the spirit and scope of the invention.

What is claimed is:

1. A clock generation circuit, comprising:
   a waveform generator for generating a waveform signal, wherein said waveform generator is clocked by an input clock signal; and
   a deskewer circuit with a plurality of logic circuits having only two flip-flops, wherein said only two flip-flops are connected to said waveform generator in parallel, for gating said waveform signal with said input clock signal to generate an output clock signal, such that said output clock signal is synchronously linked to said input clock signal.

2. The clock generation circuit according to claim 1, wherein said waveform generator is a finite state machine having a first output coupled to one of said only two flip-flops and a second output coupled to another one of said only two flip-flops.

3. The clock generation circuit according to claim 2, wherein said first output yields a value of a first half of a clock cycle and said second output yields a value of a second half of said clock cycle.

4. The clock generation circuit according to claim 3, wherein said value from said first output is different from said value from said second output in each clock cycle.

5. The clock generation circuit according to claim 1, wherein said plurality of logic circuits has a boolean expression of $$(\overline{c} \text{ AND } a) \text{ OR } (c \text{ AND } b) \text{ OR } (b \text{ AND } a),$$

wherein a and b are outputs from said only two flip-flops, and c is said input clock signal.

6. A clock generation circuit, comprising:
   a waveform generator for generating waveform signals, wherein said waveform generator is clocked by an input clock signal;
   only two flip-flops connected to said waveform generator in parallel, for receiving said waveform signals from said waveform generator; and
   a plurality of logic gates for coupling output signals from said only two flip-flops to generate an output clock signal such that said output clock signal is synchronously linked to said input clock signal.

7. The clock generation circuit according to claim 6, wherein said plurality of logic circuits has a boolean expression of $$(\bar{c} \text{ AND } a) \text{ OR } (c \text{ AND } b) \text{ OR } (b \text{ AND } a),$$

wherein a and b are outputs from said only two flip-flops, and c is said input clock signal.

8. The clock generation circuit according to claim 6, wherein said plurality of logic circuits includes three logic AND gates and one logic OR gate.

9. The clock generation circuit according to claim 6, wherein said waveform generator is a finite state machine having a first output coupled to one of said only two flip-flops and a second output coupled to another one of said only two flip-flops.

10. The clock generation circuit according to claim 9, wherein said first output yields a value of a first half of a clock cycle and said second output yields a value of a second half of said clock cycle.

11. The clock generation circuit according to claim 10, wherein said value from said first output is different from said value from said second output in each clock cycle.

* * * * *